(12) United States Patent
Lattimore et al.

(10) Patent No.: US 6,191,620 B1
(45) Date of Patent: Feb. 20, 2001

(54) SENSE AMPLIFIER/COMPARATOR CIRCUIT AND DATA COMPARISON METHOD

(75) Inventors: George McNeil Lattimore, Austin; Terry Lee Leasure, Georgetown, both of TX (US); Younes John Lotfi, Colorado Springs, CO (US); Robert Anthony Ross, Jr., Cedar Park; Gus Wai-Yan Yeung, Austin, both of TX (US)

(73) Assignee: International Business Machines Corporation, Armonk, NY (US)

( * ) Notice: Under 35 U.S.C. 154(b), the term of this patent shall be extended for 0 days.

(21) Appl. No.: 09/435,064

(22) Filed: Nov. 4, 1999

(51) Int. Cl.$^7$ ................. G11C 7/06; H03K 5/22
(52) U.S. Cl. ................. 327/55; 327/65; 327/77
(58) Field of Search .................. 327/55, 57, 51–54, 327/56, 77, 89, 63, 65; 365/185.03, 205, 207

(56) References Cited

U.S. PATENT DOCUMENTS

| | | | |
|---|---|---|---|
| 4,253,163 | * 2/1981 | Komoriya et al. | 327/57 |
| 4,972,517 | * 11/1990 | Kondou et al. | 327/65 |
| 5,568,073 | * 10/1996 | McClure | 327/57 |
| 5,615,168 | 3/1997 | Lattimore . | |
| 5,973,957 | * 10/1999 | Tedrow | 365/185.03 |
| 6,111,437 | * 8/2000 | Patel | 327/74 |

* cited by examiner

Primary Examiner—Toan Tran
(74) Attorney, Agent, or Firm—Russell D. Culbertson; Anthony V. S. England

(57) ABSTRACT

A comparator circuit (40) includes a comparator network and a comparator enabling device (80) and may be integrated with a sense amplifier circuit (41). The comparator network is adapted to receive a complementary pair of reference data signals (B, $B_{13}$) and a complementary pair of analog data signals (d1, d1b). An output of the comparator circuit (40) represents a comparison of the data represented by the reference data signals and the data represented by the analog data signals. The comparator output is generated in response to a comparator enable signal (SE) applied to the comparator enabling device (80) while the input data is applied to the comparator network. The comparator enable signal (SE) is applied at a time when the analog data signals (d1, d1b) have developed a minimum differential level.

20 Claims, 3 Drawing Sheets

SENSE AMPLIFIER/COMPARATOR CIRCUIT AND DATA COMPARISON METHOD

TECHNICAL FIELD OF THE INVENTION

This invention relates to electronic logic circuits used in digital processing systems and, more particularly, to a comparator arrangement and method for comparing data represented by digital input signals and data represented by analog input signals.

BACKGROUND OF THE INVENTION

Digital electronic memory cells are accessed using a complementary pair of bit lines. In a read operation from a digital memory cell, both bit lines are placed in an initial charge state, typically at a supply voltage level. The memory cell selected in the read operation maintains the charge level on one bit line, and allows the charge state to decay on the complementary bit line. The full charge state on one bit line and the lower charge state on the complementary bit line represents binary data, either a "1" or a "0", which was previously stored in the selected memory cell. However, since the lower charge state develops gradually on the complementary bit line, the signals present on the bit lines in a read operation are analog signals rather than digital signals.

A sense amplifier is used to convert the analog signals read from a memory cell to a complementary pair of digital signals, a true signal and a signal comprising the opposite or complement of the true signal. The sense amplifier is connected to receive inputs comprising the analog signals produced from a memory cell. Operation of the sense amplifier circuit is commonly triggered by a sense enable signal which is provided to the sense amplifier circuit at a time when a minimum voltage differential has developed between the analog signals being read from the selected memory cell. Once enabled, the sense amplifier amplifies the analog signals and produces a complementary pair of digital output signals generally through an output inverter arrangement.

In some microelectronic circuit designs, it is necessary to compare the logical states of two different signals or two different sets of complementary signals. The purpose of this comparison may be to decide what logical function needs to be performed further in the data path or logic path. One particular case in which two different sets of complementary signals must be compared is the case where data read from a memory cell is compared to some reference data. A comparator circuit for performing such a signal comparison is commonly constructed from an exclusive OR ("XOR") logic circuit. The output of an XOR circuit discharges to ground if both its inputs are at the same logical level. If the inputs to the XOR circuit are at different logical levels, then the circuit output charges to the supply voltage level.

One shortcoming of a conventional comparator circuit is that its input signals need to be true digital signals. That is, the comparator input signals must be very close to the supply voltage level ($V_{dd}$) to indicate one logical state or very close to ground potential to indicate the opposite logical state. Thus, when comparing data read from a memory cell to some reference data, the comparator operation is delayed until the analog signals from the memory cell are converted to digital signals.

The delay in a prior art comparator circuit may be described with reference to FIG. 1. FIG. 1 shows a prior art comparator circuit 10 used in conjunction with a sense amplifier 12. Sense amplifier 12 includes a pre-charge circuit 14 while comparator circuit 10 includes a pre-charge circuit 15. Prior to a read operation, the sense amplifier pre-charge circuit 14 charges the first and second sense amplifier internal nodes, 16 and 17 respectively, to a supply voltage level. In a read operation, the sense amplifier 12 receives the analog data signals at inputs d1 and d1b. For example, assume that the data being read from the respective memory cell (not shown) is represented by a high-level d1 signal. When this data is applied to the input lines d1 and d1b, the signal at internal node 16 remains substantially at the supply voltage level while the signal at internal node 17 degrades as signal d1b degrades through the respective memory cell. Once a sufficient voltage differential has developed between the signals d1 and d1b, a sense enable signal SE is asserted to the sense amplifier 12. With the sense enable signal SE asserted, internal node 17 discharges to ground potential through N-type transistor 18 and the sense enable transistor 19. Internal node 16 remains substantially at the supply voltage level. Output inverter 20 inverts the low-level signal at internal node 17 to produce a high-level digital signal A, while output inverter 21 inverts the signal at internal node 16 to produce a low-level digital signal A_. Thus, the sense amplifier converts the analog signals d1 and d1b to the pair of digital signals, A and its complement A_.

Comparator circuit 10 receives the digital signals A and A_ and compares the data represented by these complementary digital signals to a complementary pair of digital reference signals, B and B_. Assume for purposes of example that the data represented by the digital reference signals matches the data represented by signals A and A_. Thus, signal B comprises a high-level digital signal and signal B_ comprises a low-level digital signal. In the compare operation, pre-charge circuit 15 is first deactivated leaving the first and second internal comparator nodes, 23 and 24 respectively, charged to the supply voltage level. The high-level signal A places N-type transistor 25 in a conductive state while the high-level signal B places N-type transistor 26 in a conductive state. Meanwhile, the low-level digital signals A_ and B_ ensure that N-type transistors 27 and 28 are each placed in a nonconductive state. Thus, the charge at internal comparator node 24 discharges through transistors 25 and 26 to generally ground potential, while the charge on internal comparator node 23 remains substantially at the supply voltage level, reinforced through P-type transistor 29. The low-level signal at internal node 24 is inverted through the comparator output inverter 30 to produce a high-level digital comparator output signal COMP. The high-level voltage signal at node 23 is inverted through inverter 31 to produce the complement output signal COMPB, which in this case comprises a low-level digital signal.

It will be apparent from the discussion above that the comparator 10 is dependent upon the digital output from the sense amplifier 12. Comparator operation is delayed until sense amplifier 12 produces the digital output signals A and A_. The time required to produce the desired comparison in the illustrated prior art circuit is equal to the time required for sense amplifier 12 to provide its digital output signals A and A_ plus the time for comparator circuit 10 to perform its evaluation on signals A and A_ and reference signals B and B_.

SUMMARY OF THE INVENTION

It is an object of the invention to provide a comparator circuit and data comparison method for providing a comparator output based upon input signals comprising both digital data signals and analog data signals. Another object of the invention is to provide a comparator circuit for performing the desired data comparison more quickly.

The comparator circuit according to the invention includes a comparator network and a comparator enabling device. The comparator network is adapted to receive input data comprising a complementary pair of reference data signals and a complementary pair of analog data signals. An output of the comparator circuit represents a comparison of the data represented by the reference data signals and the data represented by the analog data signals. The comparator output is generated in response to a comparator enable signal which is applied to the comparator enabling device during the time that the input data is applied to the comparator network. The comparator enable signal is applied at a time when the analog data signals have developed a minimum differential level, commonly a differential equal to at least 5 to 10 percent of the supply voltage level.

One preferred use of the present comparator circuit is in association with a sense amplifier. The sense amplifier produces a digital signal output in response to a sense enable signal and a complementary pair of analog data signals driven from a memory cell. In this implementation of the invention, the comparator receives the same complementary pair of analog signals supplied to the sense amplifier circuit. Also, the comparator enable signal is associated with, or timed similarly to, the sense enable signal. In some forms of the invention, the sense enable signal and the comparator enable signal may comprise the same signal, although these enable signals may be different within the scope of the invention.

The comparator network includes a plurality of conduction paths including transistors controlled by various combinations of the analog data signals and the reference data signals. Each conduction path is coupled between an internal node of the comparator circuit and a common node. The common node is preferably connected to ground through the comparator enable device. Thus, the comparator enable device operates under control of the enable signal to couple the various conduction paths to ground. In another aspect of the invention, the various conduction paths of the comparator network are cross-coupled to provide less resistance to the common node and thus a quicker comparator response.

The comparator circuit according to the invention provides a faster compare operation relative to prior art comparator circuits. Two factors contribute to this overall increase in speed. First, in the situation in which the present comparator circuit is used with a sense amplifier, the comparator circuit bypasses the sense amplifier output inverters, thus avoiding the delay occasioned by the inverter circuits. Second, performance is enhanced by current amplification in the present comparator circuit.

These and other objects, advantages, and features of the invention will be apparent from the following description of the preferred embodiments, considered along with the accompanying drawings.

DESCRIPTION OF THE PREFERRED EMBODIMENTS

Figure 1:
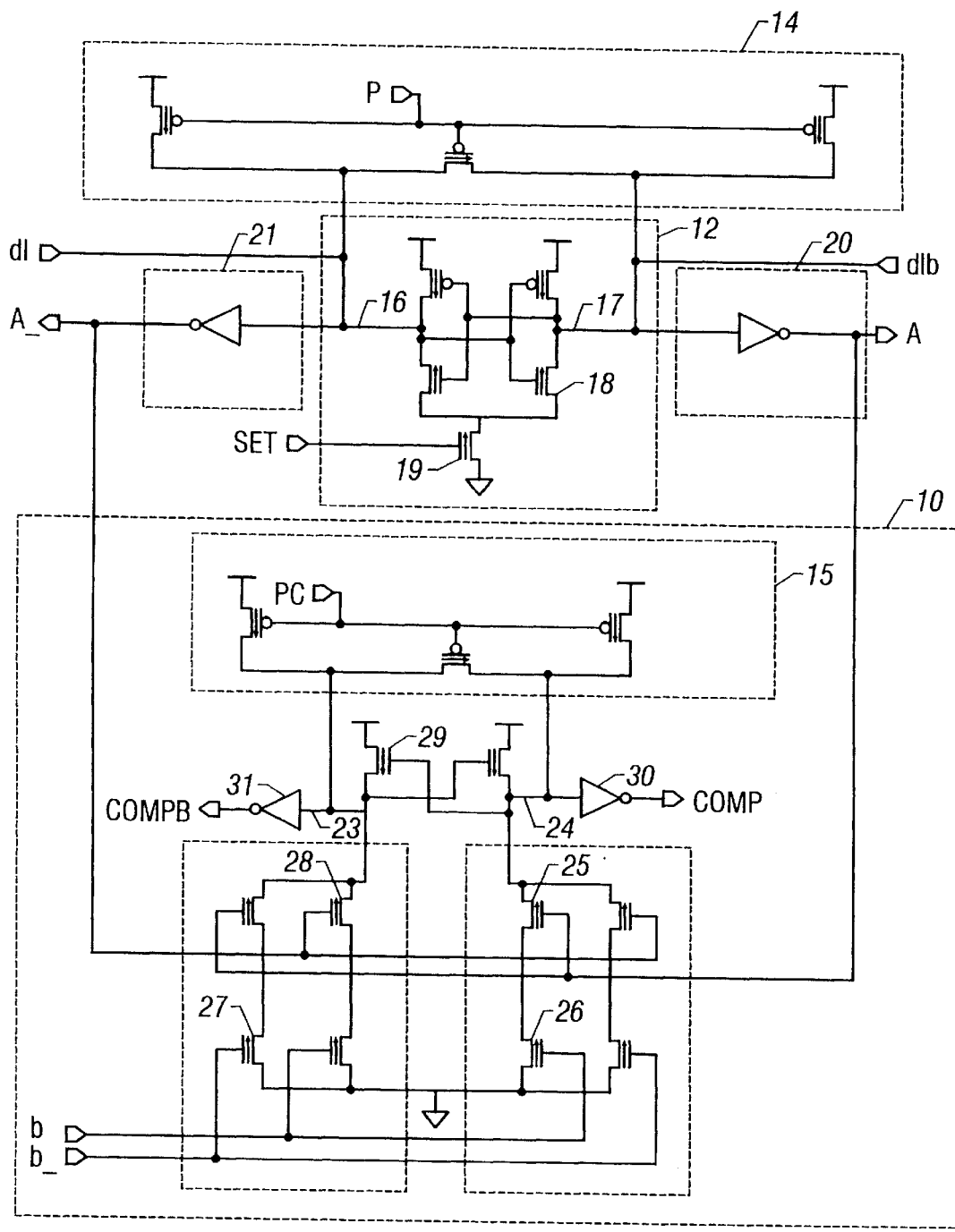
FIG. 1 is an electrical schematic diagram showing a prior art sense amplifier and comparator circuit arrangement.
Figure 2:
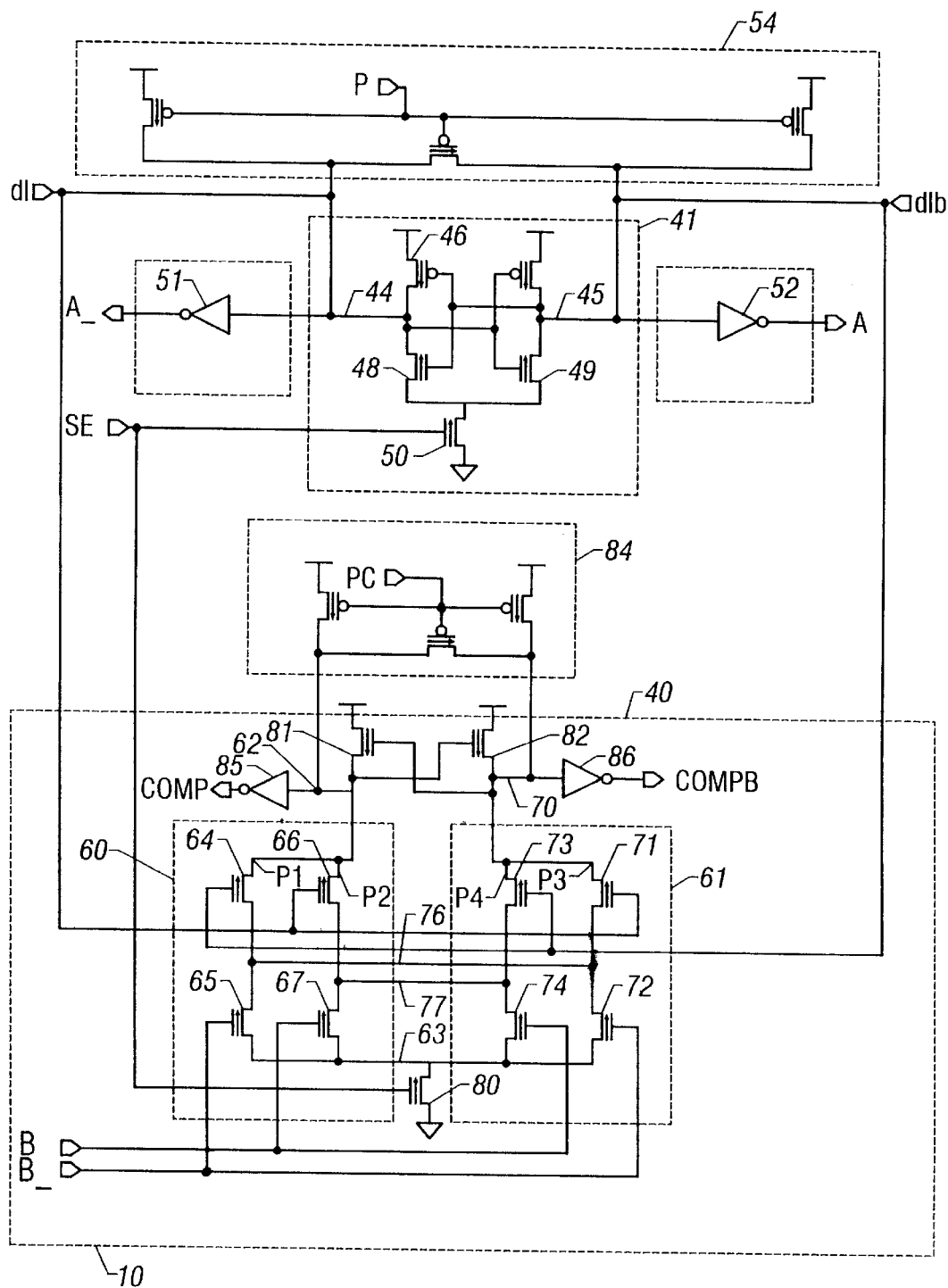
FIG. 2 is an electrical schematic diagram of a comparator circuit embodying the principles of the invention, associated with a sense amplifier.
Figure 3:
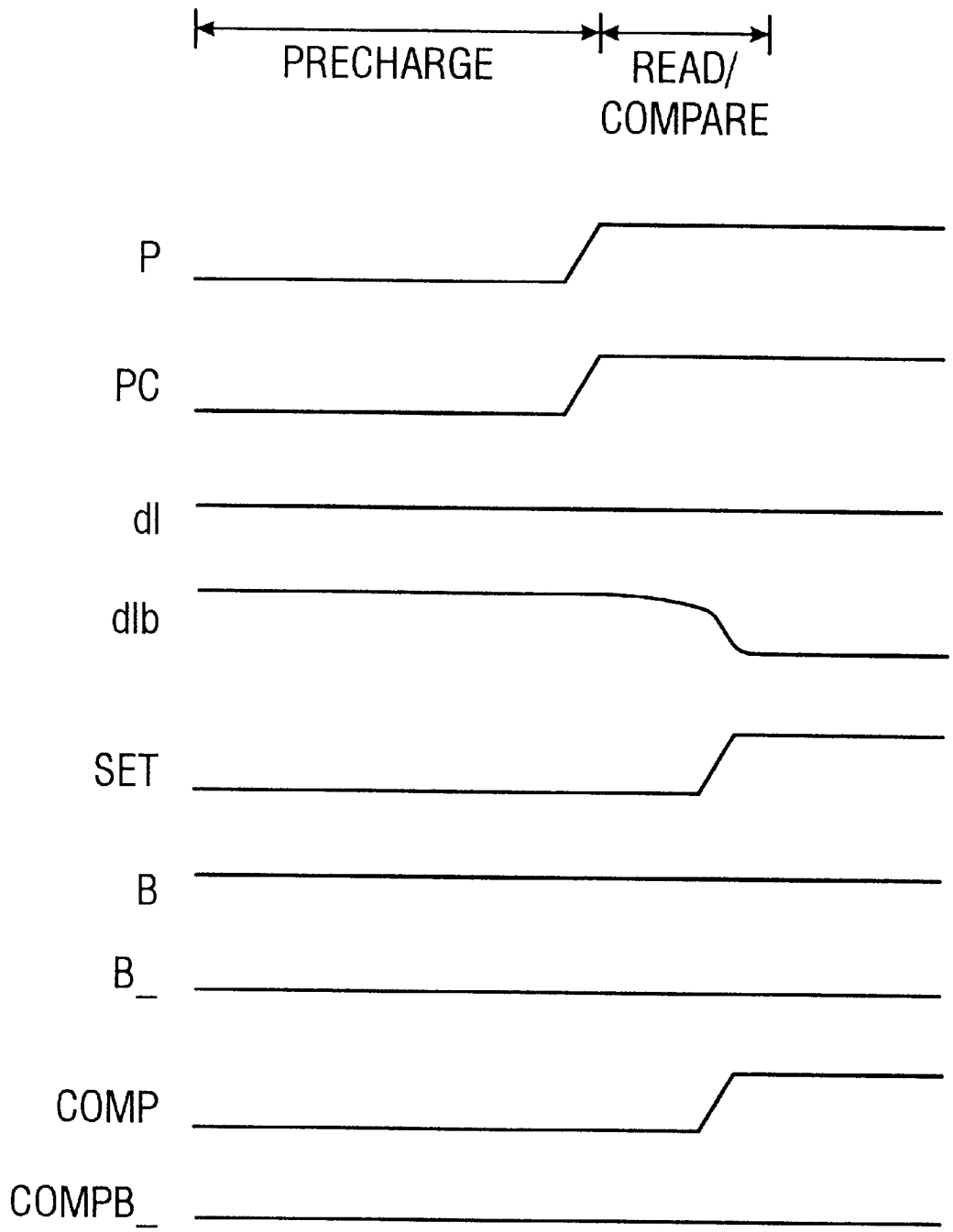
FIG. 3 is a timing chart illustrating the relative timing of signals in the comparator and sense amplifier circuits shown in FIG. 2.

A comparator circuit 40 embodying the principles of invention is shown in FIG. 2. Comparator circuit 40 is adapted to compare data read by sense amplifier 41 with data represented by a complementary pair of digital reference signals B and B__. FIG. 3 comprises a timing chart illustrating the operation of circuits 40 and 41.

Those skilled in the art will appreciate that the comparator circuit according to the invention is not limited to use in conjunction with a sense amplifier. Rather, the present comparator circuit may be used to compare digital reference data signals with analog data signals from any source. The sense amplifier arrangement is shown in FIG. 2 for purposes of example since this application is a common application for the present comparator circuit.

Digital data signals will be described in this disclosure as high-level or low-level signals. As used herein, a high-level signal refers to a signal at a voltage level near a supply level, $V_{dd}$. A low-level signal refers to a signal at or near ground potential or some other suitable reference potential. Comparator circuit 40 according to the invention operates on complementary pairs of input data signals, each pair comprising a first or true signal and a signal which is the complement of the first or true signal. Each complementary pair of signals represents a single bit of data. For example, a pair of signals comprising a high-level true signal and a low-level complementary signal may represent the value or logical state "1, " whereas a pair of signals comprising a low-level true signal and a high-level complementary signal may represent a value or logical state of "0."

The sense amplifier 41 shown in FIG. 2 converts analog data signals d1 and d1b to a complementary pair of digital output signals A and A__. Sense amplifier circuit 41 includes a first internal node 44, a second internal node 45, and a set of transistors comprising P-type transistors 46 and 47 and N-type transistors 48 and 49. A sense enable signal SE is applied to the base of a sense enable transistor 50 to trigger or enable operation of the sense amplifier circuit. An output inverter 51 inverts the signal at node 44 to provide output A__ while output inverter 52 inverts the signal at node 45 to provide output signal A. A pre-charge circuit 54 is associated with sense amplifier 41 for pre-charging nodes 44 and 45 to the supply voltage level in preparation for a read operation. Pre-charge circuit 54 is controlled by signal P. A low-level signal P activates precharging while a high-level signal P deactivates precharging.

Comparator circuit 40 according to the invention compares the data represented by analog signals d1 and d1b to the data represented by a complementary pair of digital reference signals, B and B__. These input signals (d1, d1b, B, and B__) are received at a comparator network including a match or hit network 60 and a mismatch or miss network 61. Match network 60 is connected between a first internal comparator node 62 and a common node 63, and includes a first conduction path P1 and a second conduction path P2 between the two nodes. First conduction path P1 is through N-type transistors 64 and 65 and second conduction path P2 is through N-type transistors 66 and 67.

Mismatch network 61 is connected between a second internal comparator node 70 and common node 63 and includes a first conduction path P3 and a second conduction path P4 between the two nodes. First conduction path P3 is through N-type transistors 71 and 72. Second conduction path P4 is through N-type transistors 73 and 74. In the illustrated preferred form of invention the junction between transistors 64 and 65 is coupled by line 76 to the junction between transistors 71 and 72. Similarly, the junction between transistors 66 and 67 is coupled by line 77 to the junction between transistors 73 and 74. This cross coupling between conduction paths reduces the discharge resistance of the desired path as will be discussed below in connection with the operation of the circuit.

Common node 63 is connected to ground through a comparator sense enable device 80. In this example of the comparator, the sense enable device 80 comprises an N-type transistor. In the illustrated form of the invention, transistor 80 is controlled by the same signal SE used to control the sense enable transistor 50. However, those skilled in the art will appreciate that the enable signals used to enable the comparator circuit 40 and sense amplifier circuit 41 need not be identical.

Comparator circuit 40 also includes a pair of pull-up P-type transistors 81 and 82. Transistor 81 is connected between the supply voltage source $V_{dd}$ and the first internal comparator node 62 while transistor 82 is connected between the supply voltage $V_{dd}$ and second internal comparator node 70. Also, transistor 81 is controlled by the signal at node 70 while transistor 82 is controlled by the signal at node 62.

The signal at the first internal comparator node 62 is inverted by inverter 85 to produce the digital output signal COMP. Inverter 86 inverts the signal at the second internal comparator node 70 to produce the complement digital output signal, COMPB.

A comparator pre-charge circuit 84 is also preferably associated with comparator circuit 40. Pre-charge circuit 84 is controlled through signal PC to charge internal nodes 62 and 70 to the supply voltage level prior to a compare operation. A low-level signal PC activates pre-charge circuit 84, while a high level signal PC deactivates the comparator pre-charge circuit.

The operation of comparator circuit 40 may be described with reference to FIG. 2 and to the timing chart shown in FIG. 3. Prior to receiving the analog data signals d1 and d1b, both sense amplifier 41 and comparator circuit 40 are pre-charged through their respective pre-charge circuit, 54 and 84. In sense amplifier circuit 41, internal nodes 44 and 45 are charged to the supply voltage level. In comparator circuit 40, internal nodes 62 and 70 are charged to the supply voltage level.

After the pre-charge is disabled, analog signals d1 and d1b are applied to nodes 44 and 45 of sense amplifier 41, and are also applied as inputs to the comparator network of comparator circuit 40. Digital reference signals B and B__ are also applied as inputs to comparator circuit 40 so that the data represented by those signals may be compared with the data represented by analog signals d1 and d1b. For purposes of example, and as shown in FIG. 3, signal d1 comprises the high-level signal while signal d1b degrades through the memory cell (not shown) being read by sense amplifier 41. In the example illustrated in FIG. 3, the data represented by reference data signals B and B__ match the data represented by the analog signals, with signal B comprising a high-level signal and signal B__ comprising a low-level signal. Sense enable signal SE is asserted once signal d1b degrades sufficiently to provide a minimum differential between the voltages d1 and d1b. The minimum time delay required to produce a particular voltage differential is dependent primarily upon the specific construction of the memory cell being read. Calculation of this time is well known in the art. The particular minimum differential which is required is dependent upon factors such as the relative size of the various transistors used with sense amplifier circuit 41 and comparator circuit 40. In the preferred form of the invention, the minimum voltage differential required between d1 and d1b prior to triggering the compare operation is equal to approximately 5 to 10 percent of the supply voltage level $V_{dd}$.

The asserted or high-level signal SE places comparator enable transistor 80 in a conductive state, coupling common node 63 to ground. At the time signal SE is asserted with the example data shown in FIG. 3, the low-level signal B__ places transistors 72 and 65 both in a nonconductive state to block the respective conduction paths P1 and P3. However, transistors 66 and 67 are both placed in a conductive state by signals d1 and B, respectively, enabling conduction path P2. The enabled conduction path P2, the second path of match network 60, allows first internal comparator node 62 to discharge quickly to ground through conduction path P2 and comparator enable transistor 80. At the same time, signal d1b places transistor 73 in a partially conductive state and signal B places transistor 74 in a fully conductive state. However, even though second internal comparator node 70 may initially discharge slightly through transistors 73, 74, and 80, the quickly developing low-level signal at first internal comparator node 62 places pull-up transistor 82 in a conductive state to help maintain a high-level signal at the second internal comparator node. Inverter 85 inverts the low-level signal at first internal comparator node 62 to produce a logically high-level COMP signal whereas inverter 86 inverts the high-level voltage signal at node 70 to a low-level signal COMPB. This combination of a logically high-level COMP signal and logically low-level COMPB signal indicates a match between the data represented by analog signals d1 and d1b and the data represented by digital reference signals B and B__.

It will be noted that the preferred cross-coupling line 77 effectively increases the rate at which node 62 in the above-described example may discharge. That is, line 77 allows the charge at node 62 to discharge through both transistor 67 and transistor 74, both fully conductive under control of high-level signal B in the example. Cross-coupling line 76 serves a similar function as between transistors 65 and 72 in the case where signal B__ is a high level signal.

Sense amplifier 41 produces the sense amplifier outputs A and A__ in response to sense enable signal SE and analog signals d1 and d1b. These outputs A and A__ are not used for the inputs to the comparator circuit 40, but may still be used to latch the results of the sense amplifier analog-to-digital conversion for test and other purposes. In the given example described above with reference to FIG. 3, sense amplifier 41 also reduces the signal level at sense amplifier node 45 and therefore effectively reduces the voltage level of signal d1b. Sense amplifier 41 thus assists the comparator circuit 40. Specifically, the effective reduction of the voltage level of signal d1b in the given example places transistor 73 of the comparator circuit in a substantially nonconductive state, preventing node 70 from discharging through conduction path P4 and helping to maintain the node near the supply voltage level.

The particular data and logical states shown in FIG. 3 are shown solely for purposes of describing the operation of comparator circuit 40. Different logical states would produce a different operation of the comparator circuit. For example, if the signal levels of d1 and d1b were reversed with respect to the signals shown in FIG. 3, transistors 73 and 74 of mismatch network 61 would be activated to allow node 70 to discharge to ground. The conduction paths P1 and P2 through match network 60 would be blocked, and comparator node 62 would remain near the supply voltage level. In this case signal COMP would comprise a low-level signal while signal COMPB would comprise a high-level signal and this complementary pair would indicate that the data represented by signals d1 and d1b does not match the data represented by signals B and B_.

Thus, regardless of the particular states of the signals applied to comparator circuit 40, the present invention bypasses output inverters 50 and 51 of sense amplifier circuit 41, and applies analog signals d1 and d1b for comparison with digital signals B and B_. Bypassing inverters 50 and 51 contributes to an overall improvement in the speed of the compare operation.

In the above-described preferred embodiment of the invention, the single enable signal SE is used to enable both the comparator circuit 40 and the sense amplifier circuit 41. It will be appreciated that the two circuits may employ different enable signals. The different enable signals may be timed somewhat differently and/or may have different rise characteristics within the scope of the present invention and the following claims.

The above described preferred embodiments are intended to illustrate the principles of the invention, but not to limit the scope of the invention. Various other embodiments and modifications to these preferred embodiments may be made by those skilled in the art without departing from the scope of the following claims. For example, various voltage levels can be used as high-level and low-level signals depending upon the transistor technology in which the circuits 40 and 41 are implemented. Also, the logical meaning of the various signals may be easily reversed within the scope of the invention and the following claims.

What is claimed is:

1. A circuit comprising:
   (a) a sense amplifier adapted to produce a first digital data output signal and a complementary digital data output signal in response to a first analog data signal, a complementary analog data signal, and a sense enable signal; and
   (b) a comparator adapted to produce a comparator output in response to the first analog data signal, the complementary analog data signal, a first reference data signal, a complementary reference data signal, and a comparator enable signal associated with the sense enable signal, the comparator output indicating whether the data represented by the first analog data signal and complementary analog data signal matches data represented by the first reference data signal and complementary reference data signal.

2. The circuit of claim 1 wherein the comparator enable signal comprises the sense enable signal.

3. The circuit of claim 1 wherein the sense amplifier includes:
   (a) a first output inverter coupled between a first analog signal node and a first sense amplifier output node; and
   (b) a second output inverter coupled between a complementary analog signal node and a second sense amplifier output node.

4. The circuit of claim 1 wherein the comparator circuit includes:
   (a) a match transistor network having
      (i) a first conduction path controlled by the complementary analog data signal and the complementary reference data signal, and
      (ii) a second conduction path controlled by the first analog data signal and the first reference data signal, the first and second conduction paths of the match transistor network connected in parallel between a first internal comparator node and a common node;
   (b) a mismatch transistor network having
      (i) a first conduction path controlled by the complementary reference data signal and the first analog data signal, and
      (ii) a second conduction path controlled by the complementary analog data signal and the first reference data signal;
   the first and second conduction paths of the mismatch transistor network connected in parallel between a second internal comparator node and the common node; and
   (c) a comparator enable transistor connected between the common node and ground, the comparator enable transistor being controlled by the comparator enable signal.

5. The circuit of claim 4 wherein the first conduction path of the match network includes two series connected N-type transistors, the first conduction path of the mismatch transistor network includes two series connected N-type transistors, and the junction between the two first conduction path N-type transistors of the match network is coupled to the junction between the two first conduction path N-type transistors of the mismatch network.

6. The circuit of claim 4 wherein the second conduction path of the match network includes two series connected N-type transistors, the second conduction path of the mismatch transistor network includes two series connected N-type transistors, and the junction between the two second conduction path N-type transistors of the match network is coupled to the junction between the two second conduction path N-type transistors of the mismatch network.

7. The circuit of claim 4 wherein:
   (a) the first conduction path of the match network includes two series connected N-type transistors, the first conduction path of the mismatch transistor network includes two series connected N-type transistors, and the junction between the two first conduction path N-type transistors of the match network is coupled to the junction between the two first conduction path N-type transistors of the mismatch network; and
   (b) the second conduction path of the match network includes two series connected N-type transistors, the second conduction path of the mismatch transistor network includes two series connected N-type transistors, and the junction between the two second conduction path N-type transistors of the match network is coupled to the junction between the two second conduction path N-type transistors of the mismatch network.

8. A comparator circuit comprising:
   (a) a comparator network adapted to be enabled to produce a comparator output in response to a complementary pair of analog data signals and a complementary pair of reference data signals, the comparator output indicating whether the data represented by the complementary pair of analog data signals matches data represented by the complementary pair of reference data signals; and
   (b) a comparator enabling device connected between the comparator network and ground, the comparator enabling device enabling the comparator network in response to a comparator enable signal.

9. The comparator circuit of claim 8 wherein the comparator enable signal comprises a sense enable signal also utilized by a sense amplifier to sense the data represented by the complementary analog data signals.

10. The comparator circuit of claim 8 wherein the comparator network is connected between first and second internal comparator nodes and a common node, and wherein the comparator enabling device is connected between the common node and ground.

11. The comparator circuit of claim 10 wherein the first internal comparator node is coupled to a first comparator output node through a first output inverter and the second internal comparator node is coupled to a second output node through a second output inverter.

12. The comparator circuit of claim 8 wherein the comparator network includes:
  (a) a match transistor network having
    (i) a first conduction path controlled by a complementary analog data signal of the complementary analog data signal pair and a complementary reference data signal of the complementary reference data signal pair, and
    (ii) a second conduction path controlled by a first analog data signal of the complementary analog data signal pair and a first reference data signal of the complementary reference data signal pair,
  the first and second conduction paths of the match transistor network connected in parallel between a first internal comparator node and a common node;
  (b) a mismatch transistor network having
    (i) a first conduction path controlled by the first analog data signal and the complementary reference data signal, and
    (ii) a second conduction path controlled by the complementary analog data signal and the first reference data signal;
  the first and second conduction paths of the mismatch transistor network connected in parallel between a second internal comparator node and the common node.

13. The comparator circuit of claim 12 wherein the comparator enable device comprises:
  (a) a comparator enable transistor connected between the common node and ground, the comparator enable transistor being controlled by the comparator enable signal.

14. The comparator circuit of claim 12 wherein the first conduction path of the match network includes two series connected N-type transistors, the first conduction path of the mismatch transistor network includes two series connected N-type transistors, and the junction between the two first conduction path N-type transistors of the match network is coupled to the junction between the two first conduction path N-type transistors of the mismatch network.

15. The comparator circuit of claim 12 wherein the second conduction path of the match network includes two series connected N-type transistors, the second conduction path of the mismatch transistor network includes two series connected N-type transistors, and the junction between the two second conduction path N-type transistors of the match network is coupled to the junction between the two second conduction path N-type transistors of the mismatch network.

16. The comparator circuit of claim 12 wherein:
  (a) the first conduction path of the match network includes two series connected N-type transistors, the first conduction path of the mismatch transistor network includes two series connected N-type transistors, and the junction between the two first conduction path N-type transistors of the match network is coupled to the junction between the two first conduction path N-type transistors of the mismatch network; and
  (b) the second conduction path of the match network includes two series connected N-type transistors, the second conduction path of the mismatch transistor network includes two series connected N-type transistors, and the junction between the two second conduction path N-type transistors of the match network is coupled to the junction between the two second conduction path N-type transistors of the mismatch network.

17. A method of comparing data represented by a complementary pair of digital reference data signals with data represented by a complementary pair of analog data signals, the method comprising the steps of: p1 (a) applying the complementary pair of analog data signals to a comparator network;
  (b) applying the complementary pair of reference data signals to the comparator network; and
  (c) applying a comparator enable signal to enable the comparator network to produce a comparator output once a minimum voltage differential is present between the two analog data signals, the comparator output indicating whether the data represented by the complementary pair of analog data signals matches the data represented by the complementary pair of reference data signals.

18. The method of claim 17 wherein the comparator network includes a match network and a mismatch network and the steps of applying the complementary pair of analog data signals and complementary pair of reference data signals comprises the steps of:
  (a) applying a complementary analog data signal of the complementary analog data signal pair and a complementary reference data signal of the complementary reference data signal pair to control a first conduction path of the match network;
  (b) applying a first analog data signal of the complementary analog data signal pair and a first reference data signal of the complementary reference signal pair to control a second conduction path of the match network;
  (c) applying the first analog data signal and the complementary reference data signal to control a first conduction path of the mismatch network; and
  (d) applying the complementary analog data signal and the first reference data signal to control a second conduction path of the mismatch network.

19. The method of claim 18 wherein the step of applying the comparator enable signal electrically couples a common node to ground, and wherein both the match and mismatch networks are connected to the common node.

20. The method of claim 18 further comprising the steps of:
  (a) for the first conduction path of the match network, applying the complementary reference data signal to provide a first additional conduction path through the mismatch network;
  (b) for the second conduction path of the match network, applying the first reference data signal to provide a second additional conduction path through the mismatch network;
  (c) for the first conduction path of the mismatch network, applying the complementary reference data signal to provide a first additional conduction path through the match network; and
  (d) for the second conduction path of the mismatch network, applying the first reference data signal to provide a second additional conduction path through the match network.

* * * * *

UNITED STATES PATENT AND TRADEMARK OFFICE
CERTIFICATE OF CORRECTION

PATENT NO. : 6,191,620 B1
DATED : February 20, 2001
INVENTOR(S) : Lattimore et al.

Page 1 of 1

It is certified that error appears in the above-identified patent and that said Letters Patent is hereby corrected as shown below:

ABSTRACT,
Line 5, change "$B_{13}$" to -- $B_{\_}$ --.

Column 10,
Line 10, delete "p1" and move the text beginning with "(a)" to the next line.

Signed and Sealed this

Twenty-fifth Day of December, 2001

*Attest:*

*Attesting Officer*

JAMES E. ROGAN
*Director of the United States Patent and Trademark Office*